(12) United States Patent
Yamazoe et al.

(10) Patent No.: US 7,228,377 B2
(45) Date of Patent: Jun. 5, 2007

(54) SEMICONDUCTOR INTEGRATED CIRCUIT DEVICE, IC CARD, AND MOBILE TERMINAL

(75) Inventors: Takanori Yamazoe, Hadano (JP); Takashi Tase, Tokorozawa (JP); Junji Shigeta, Fuchu (JP); Nobutaka Nagasaki, Iruma (JP); Eiji Yamasaki, Kodaira (JP); Nobuhiro Oodaira, Akishima (JP); Kozo Katayama, Tokyo (JP)

(73) Assignee: Renesas, Technology Corp., Tokyo (JP)

( * ) Notice: Subject to any disclaimer, the term of this patent is extended or adjusted under 35 U.S.C. 154(b) by 520 days.

(21) Appl. No.: 10/857,888

(22) Filed: Jun. 2, 2004

(65) Prior Publication Data

US 2004/0252561 A1 Dec. 16, 2004

(30) Foreign Application Priority Data

Jun. 6, 2003 (JP) ............................. 2003-162468

(51) Int. Cl.
*G06F 12/00* (2006.01)
(52) U.S. Cl. ...................... 711/103; 711/154; 711/100; 365/185.33
(58) Field of Classification Search ................ 711/103, 711/100, 154; 365/185.33
See application file for complete search history.

(56) References Cited

U.S. PATENT DOCUMENTS

| 6,128,694 | A | * | 10/2000 | Decker et al. | ............... | 711/103 |
| 6,195,511 | B1 | * | 2/2001 | Harada | ........................ | 396/300 |
| 7,032,081 | B1 | * | 4/2006 | Gefen et al. | ................. | 711/154 |
| 2006/0190421 | A1 | * | 8/2006 | Suzuki et al. | ................... | 707/1 |

* cited by examiner

*Primary Examiner*—Kimberly McLean-Mayo
(74) *Attorney, Agent, or Firm*—Reed Smith LLP; Stanley P. Fisher, Esq.; Juan Carlos A. Marquez, Esq.

(57) ABSTRACT

In a semiconductor integrated circuit device equipped with a flash memory and an EEPROM which are nonvolatile memories, the invention provides a technique that makes it possible to restrict an EEPROM capacity to a minimum necessary amount and reduce a chip area. Data of a minimal size required for one application program and rewritten frequently is stored in the EEPROM, and the EEPROM is configured to have a capacity of about that minimal size. Data of the same size that are respectively handled by other applications and rewritten frequently are stored in the flash memory. With respect to an application that is actually used, its data stored in the flash memory is transferred to the EEPROM and used. Data transfer between the flash memory and the EEPROM is performed if necessary. Consequently, the EEPROM capacity can be reduced and chip area reduction can be achieved.

18 Claims, 18 Drawing Sheets

FIG. 3

| | FLASH MEMORY | EEPROM |
|---|---|---|
| AREA OF A MEMORY CELL | $4\sim 8F^2$ | SEVERAL TENS OF $F^2$ |
| READ | MEDIUM-HIGH SPEED | MEDIUM-HIGH SPEED |
| UNIT OF REWRITE | BLOCK SEVERAL KBYTES TO SEVERAL TENS OF KBYTES | BYTE |
| UNIT OF ERASURE | BLOCK SEVERAL KBYTES TO SEVERAL TENS OF KBYTES | BYTE |
| REWRITE CYCLES | $10^{3\sim 4}$ | $10^{5\sim 6}$ |

SEMICONDUCTOR INTEGRATED CIRCUIT DEVICE, IC CARD, AND MOBILE TERMINAL

CLAIM OF PRIORITY

The present application claims priority to Japanese application JP 2003-162468 filed on Jun. 6, 2003, the content of which is hereby incorporated by reference in its entirety.

BACKGROUND OF THE INVENTION

1. Field of the Invention

The present invention generally relates to a semiconductor integrated circuit (IC) device and a mobile terminal equipped with that IC device and, more specifically, to an effective technique for applying flash memory and electrically erasable programmable read-only memory (EEPROM) configurations in the semiconductor IC device.

2. Discussion of Background

FIG. 1 is an example block diagram of functions of an integrated circuit (IC) device. A microcomputer 1 which is an example of a semiconductor IC device is made up of a CPU (Central Processing Unit) 2, a set of memories consisting of a ROM (Read Only Memory) 4, an SRAM (Static Random Access Memory) 5, and an EEPROM (Electrically Erasable Programmable Read Only Memory) 6, an I/O port 10 to interface with an external device, a clock generation circuit 8 to supply clocks to the CPU 2 and other circuits, a timer 3 for time control over a system timer and the memory circuits, a system control logic 9, a co-processor 7, an address bus 11, a data bus 12, and other components.

In general, a boot program for starting up the CPU 2 and application software are stored in the ROM 4. Diverse types of data that may be rewritten at a high frequency are stored in the EEPROM 6 that enables data rewriting in units of bytes. Taking an example of an IC card chip built in a mobile phone, data such as telephone numbers, charging information, and call memorandums are stored in the EEPROM 6. Unfortunately, time consumed for debugging software tends to make it hard to shorten a turn around time (TAT).

SUMMARY OF THE INVENTION

It has been recognized that what is needed is reduced EEPROM capacity and reduced chip area on a semiconductor IC device. Broadly speaking, the present invention fills these needs by replacing read only memory (ROM) with flash memory in a semiconductor device. It should be appreciated that the present invention can be implemented in numerous ways, including as a process, an apparatus, a system, a device or a method.

It is thus an object of the present invention to provide a technique that makes it possible to restrict the EEPROM capacity to a minimum necessary amount and reduce the chip area in a semiconductor IC device.

The above and other objects and novel features of the present invention will be apparent from the description of the present specification and the accompanying drawings.

The present invention offers a semiconductor device comprising a flash memory which includes nonvolatile memory cells and from and into which data can be erased and written in units of blocks and an EEPROM which includes nonvolatile memory cells and from and into which data can be erased and written in units of bytes. The flash memory is to store a plurality of applications, each comprising a program for carrying out processing tasks of the application and data to be processed by the program. When a first application, one of the plurality of applications, is activated, data of the first application is loaded from the flash memory into the EEPROM and retained in the EEPROM until a second application, one of the plurality of application, is activated.

Therefore, according to the semiconductor IC device and IC card of the present invention, the EEPROM capacity can be reduced, the total nonvolatile memory area decreases, and chip area reduction can be achieved.

BRIEF DESCRIPTION OF THE DRAWINGS

The present invention will be readily understood by the following detailed description in conjunction with the accompanying drawings. To facilitate this description, like reference numerals designate like structural elements.

FIG. 3 provides a comparison list of general properties of a flash memory and an EEPROM, in accordance with an embodiment of the present invention;

DESCRIPTION OF THE PREFERRED EMBODIMENTS

An invention for a semiconductor integrated circuit device equipped with a flash memory and an EEPROM, which are nonvolatile memories, is disclosed. Numerous specific details are set forth in order to provide a thorough understanding of the present invention. It will be understood, however, to one skilled in the art, that the present invention may be practiced with other specific details.

As discussed above, time consumed for debugging software tends to make it hard to shorten a turn around time (TAT) in an IC card. As a means for solving that and to make it possible to change or add application software to an IC card, a move to replace the ROM 4 by a flash memory 13 is found.

Figure 1:
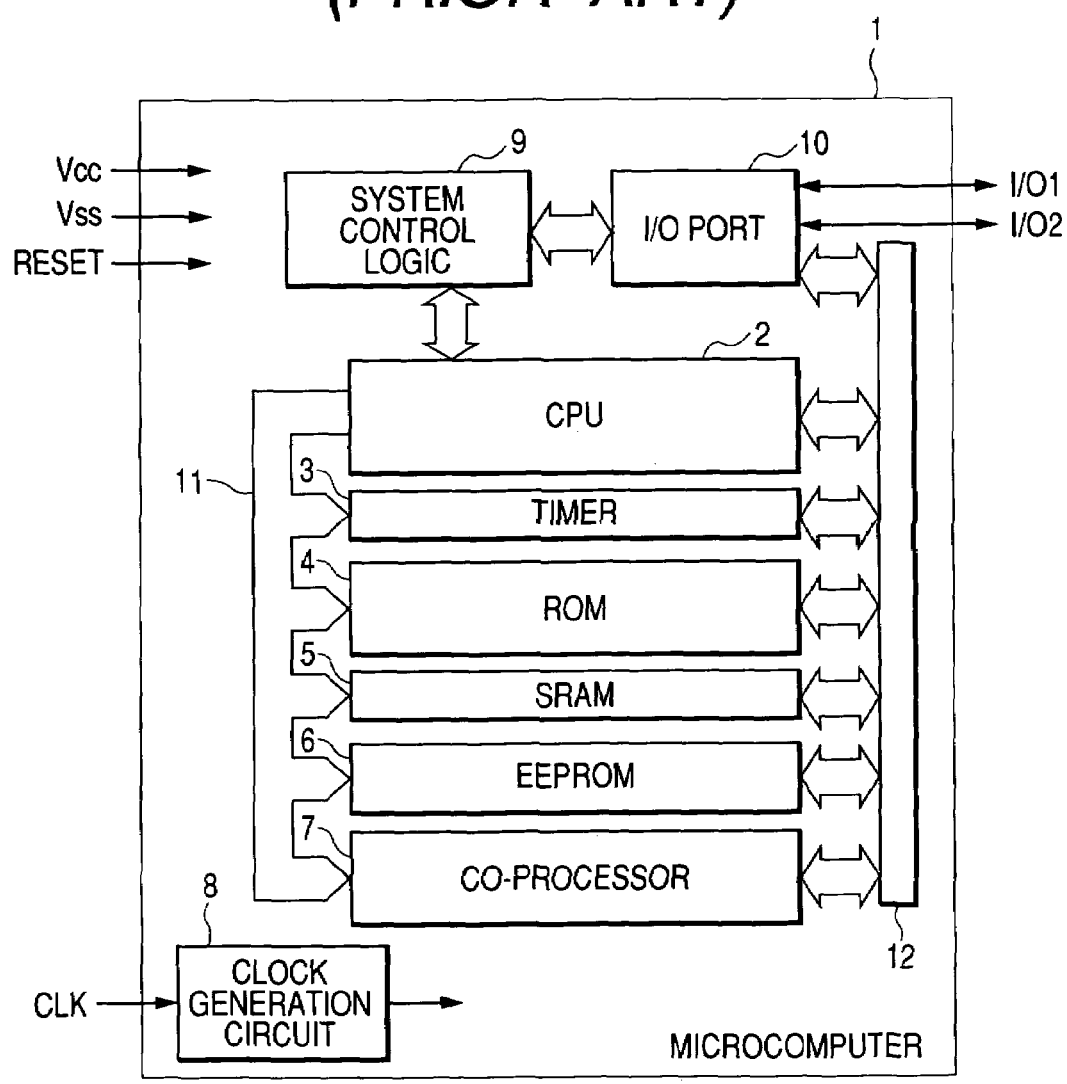
FIG. 1 is a diagram showing a microcomputer configuration which is an example of a semiconductor IC device.
Figure 2:
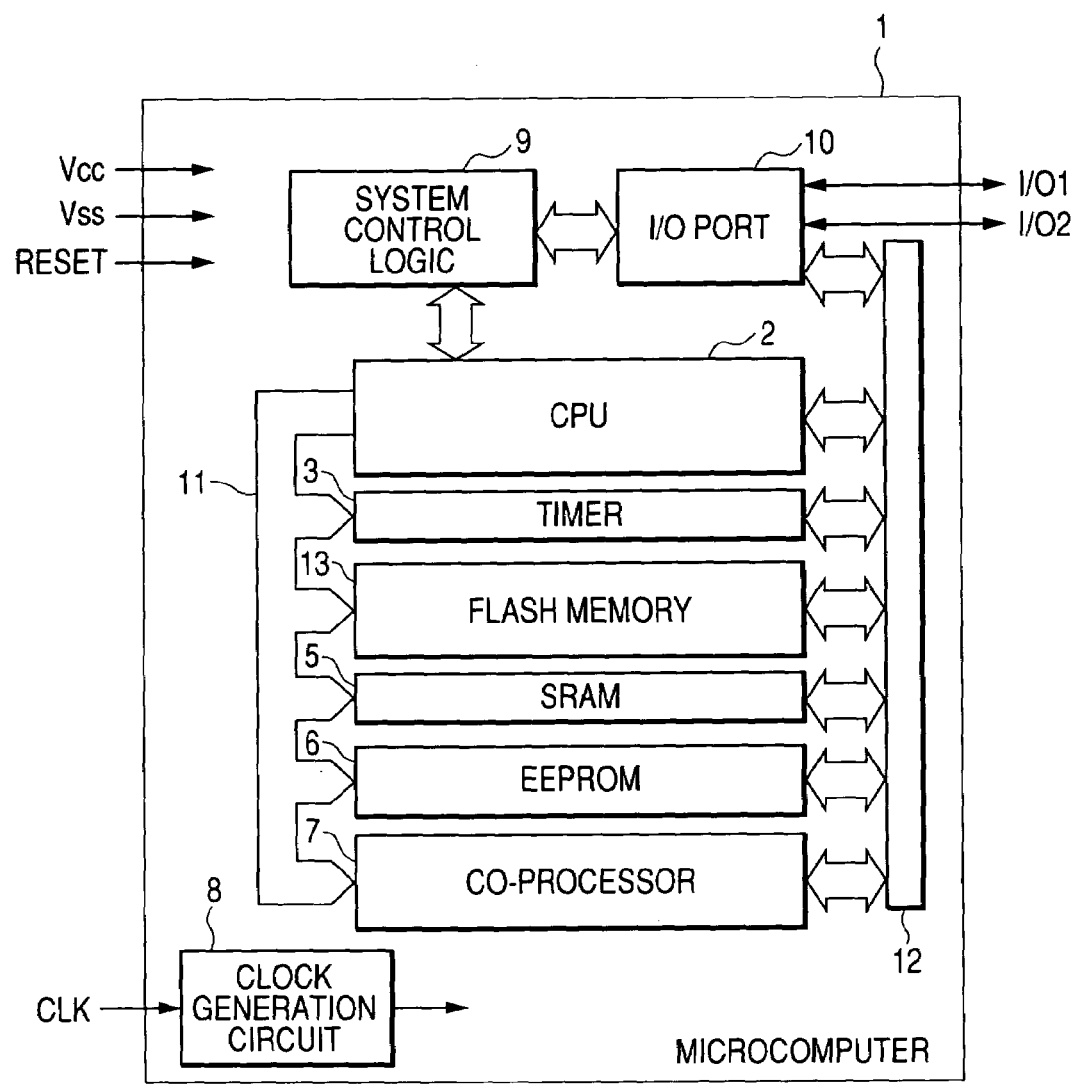
FIG. 2 is a diagram showing a microcomputer configuration using a flash memory instead of a ROM, in accordance with an embodiment of the present invention.

FIG. 2 is a diagram showing a microcomputer configuration using a flash memory instead of a ROM, in accordance with an embodiment of the present invention. The flash memory 13 has different application from the application of the EEPROM 6, enables data rewriting in units of blocks, and is suitable for storing application software that need not be rewritten frequently.

FIG. 3 shows a comparison list of general properties of the flash memory and the EEPROM, in accordance with an embodiment of the present invention. As is apparent from the list table of FIG. 3, flash memory data is rewritten in units of several Kbytes to several tens of K bytes, whereas EEPROM data can be rewritten in units of one byte. Rewrite cycles of the flash memory are the order of several thousand cycles, whereas the EEPROM data can be rewritten hundreds of thousand of times. By comparison in terms of only these parameters, the EEPROM performance is better. By comparison in terms of an area occupied by each memory component mounted on the chip, the EEPROM occupies the area that is two or three times as large as the area of the flash memory. In the list table of FIG. 3, unit F is the minimum dimensions of a memory component fabricated on the chip.

A reason the area of the EEPROM fabricated on the chip is much larger is as follows. If the flash memory and the EEPROM are constructed, using same nonvolatile memory cells, switch MOSs need to be inserted between two successive bytes of bit lines in the EEPROM array to make it possible to rewrite data in units of bytes.

Figure 4:
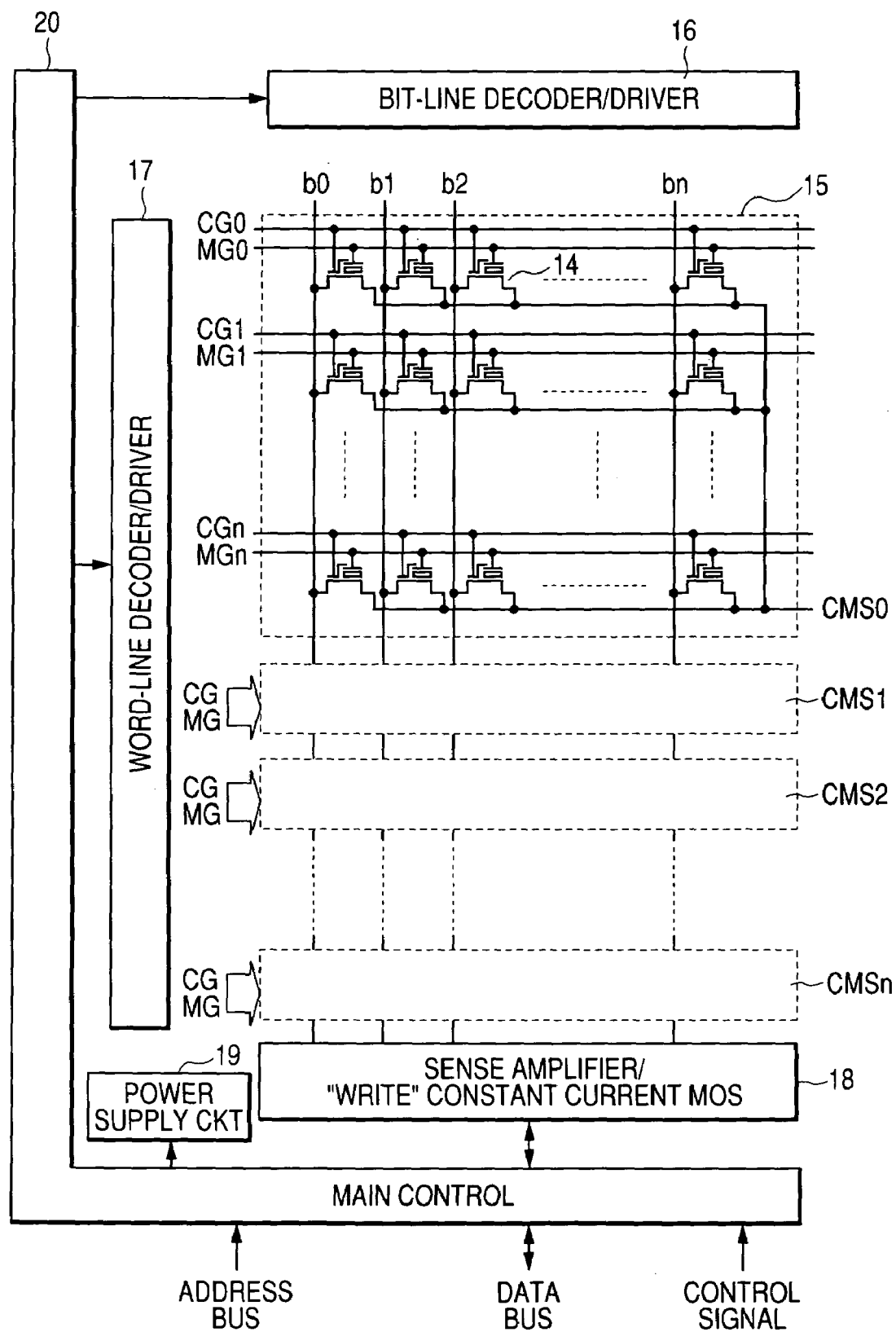
FIG. 4 is a diagram showing the configuration of a flash memory constructed by using split-type MONOS memory cells, in accordance with an embodiment of the present invention.

FIG. 4 shows an example of a flash memory array constructed by using split-type Metal Oxide Nitride Oxide Semiconductor (MONOS) nonvolatile memory cells, in accordance with an embodiment of the present invention.

Figure 5:
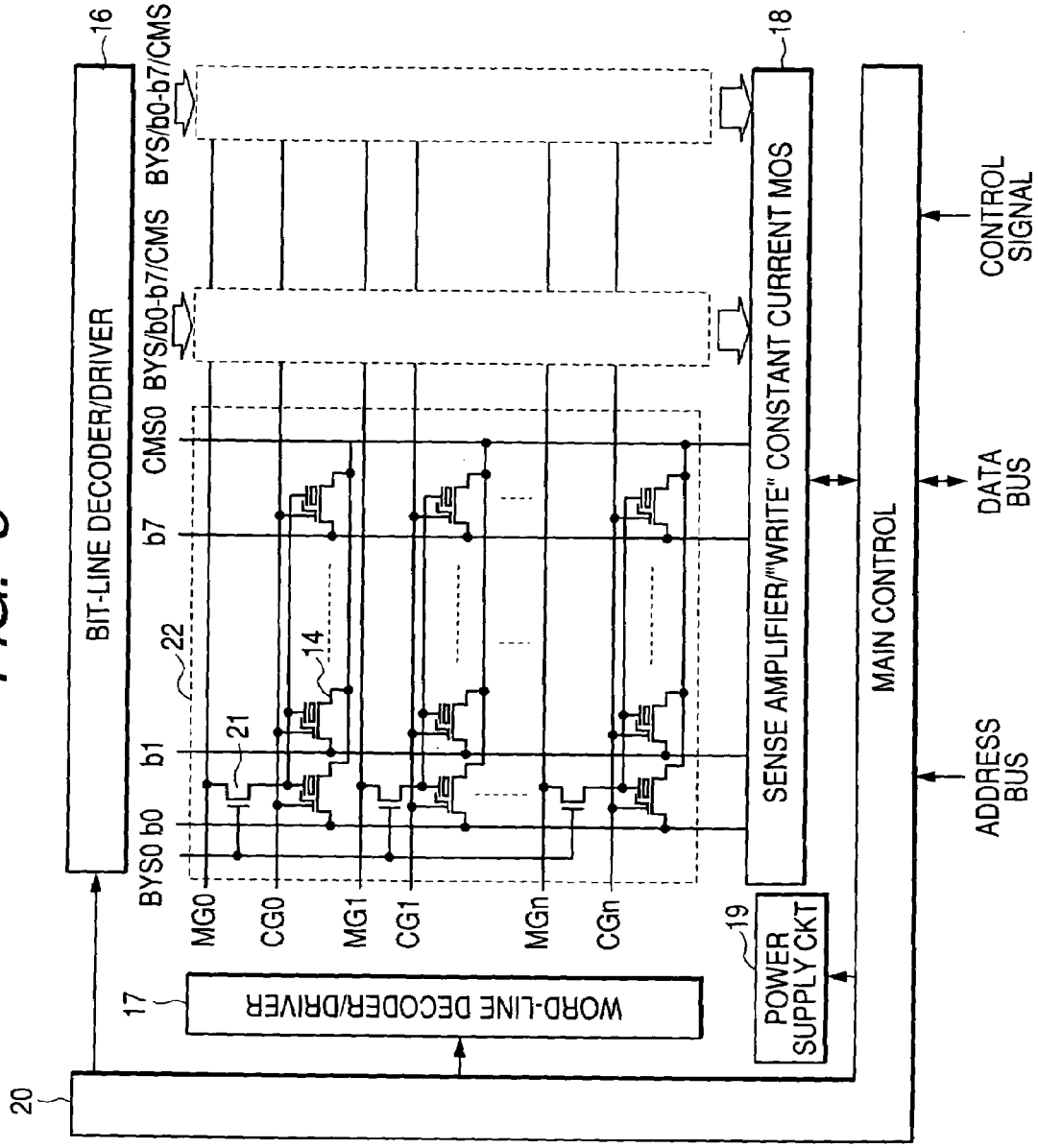
FIG. 5 is a diagram showing the configuration of an EEPROM constructed by using split-type MONOS memory cells, in accordance with an embodiment of the present invention.

FIG. 5 shows an example of an EEPROM array constructed by using the same cells, in accordance with an embodiment of the present invention.

As shown in FIG. 4, for example, the flash memory is made up of, among other things, split-type MONOS memory cells 14, flash memory erase/write blocks 15, a bit-line decoder/driver 16, a word-line decoder/driver 17, a sense amplifier/"write" constant current MOS 18, a power supply circuit 19, and a main control 20.

As shown in FIG. 5, for example, the EEPROM is made up of, among other things, split-type MONOS memory cells 14, EEPROM one-byte erase/write blocks 22, a bit-line decoder/driver 16, a word-line decoder/driver 17, a sense amplifier/"write" constant current MOS 18, a power supply circuit 19, and a main control 20.

As shown in FIG. 5, switch MOSs 21 are inserted between two successive bytes of bit lines and these switch MOSs 21 turn on/off high voltage application to memory gates MG0, MG1, . . . , MGn, which is required to erase data from or write data into the memory cells. Thus, for the switch MOSs 21, high-voltage MOSs that can endure a high drain-source voltage are used and, consequently, the areas of the MOSs increase.

Figure 6:
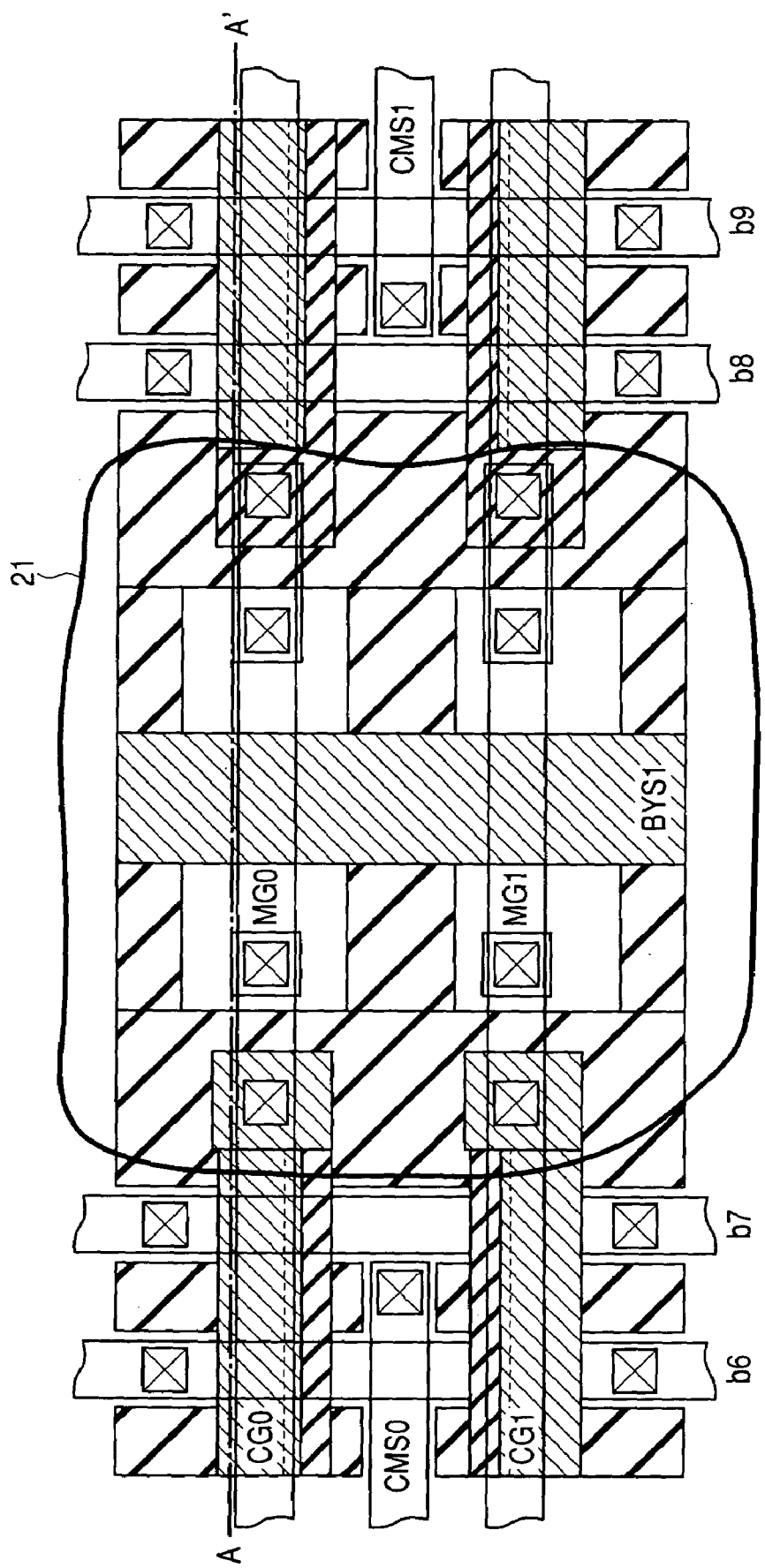
FIG. 6 is a plan view of a partial chip layout focusing on a switch Metal Oxide Semiconductor (MOS) which is embodied as a high-voltage positive-channel MOS (PMOS) in the EEPROM configuration, in accordance with an embodiment of the present invention.

FIG. 6 shows a plan view of a partial chip layout focusing on the switch MOS 21 that is embodied as a high-voltage PMOS, in accordance with an embodiment of the present invention.

Figure 7:
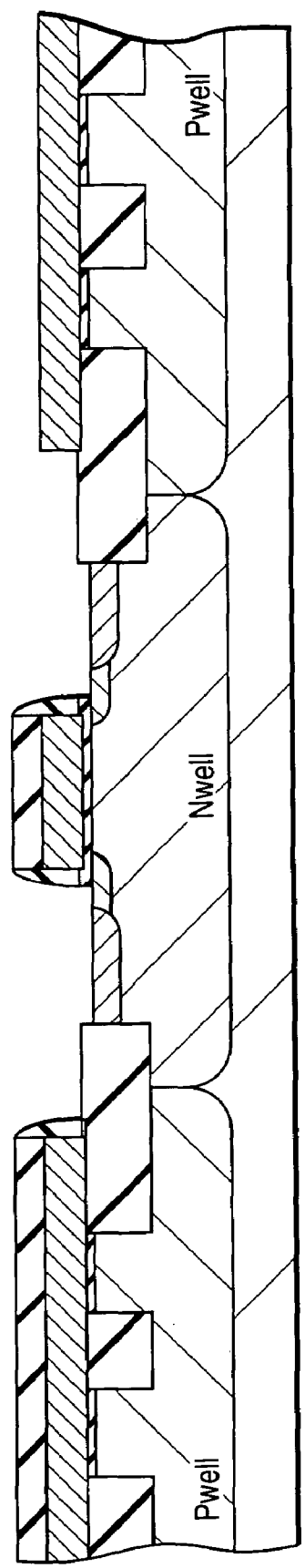
FIG. 7 is a cross-sectional view of section A-A' in FIG. 6, in accordance with an embodiment of the present invention.

FIG. 7 is a cross-sectional view of section A-A' in FIG. 6, in accordance with an embodiment of the present invention. As is apparent from FIGS. 6 and 7, the switch MOS 21 is about four times as large as a memory cell.

Figure 8:
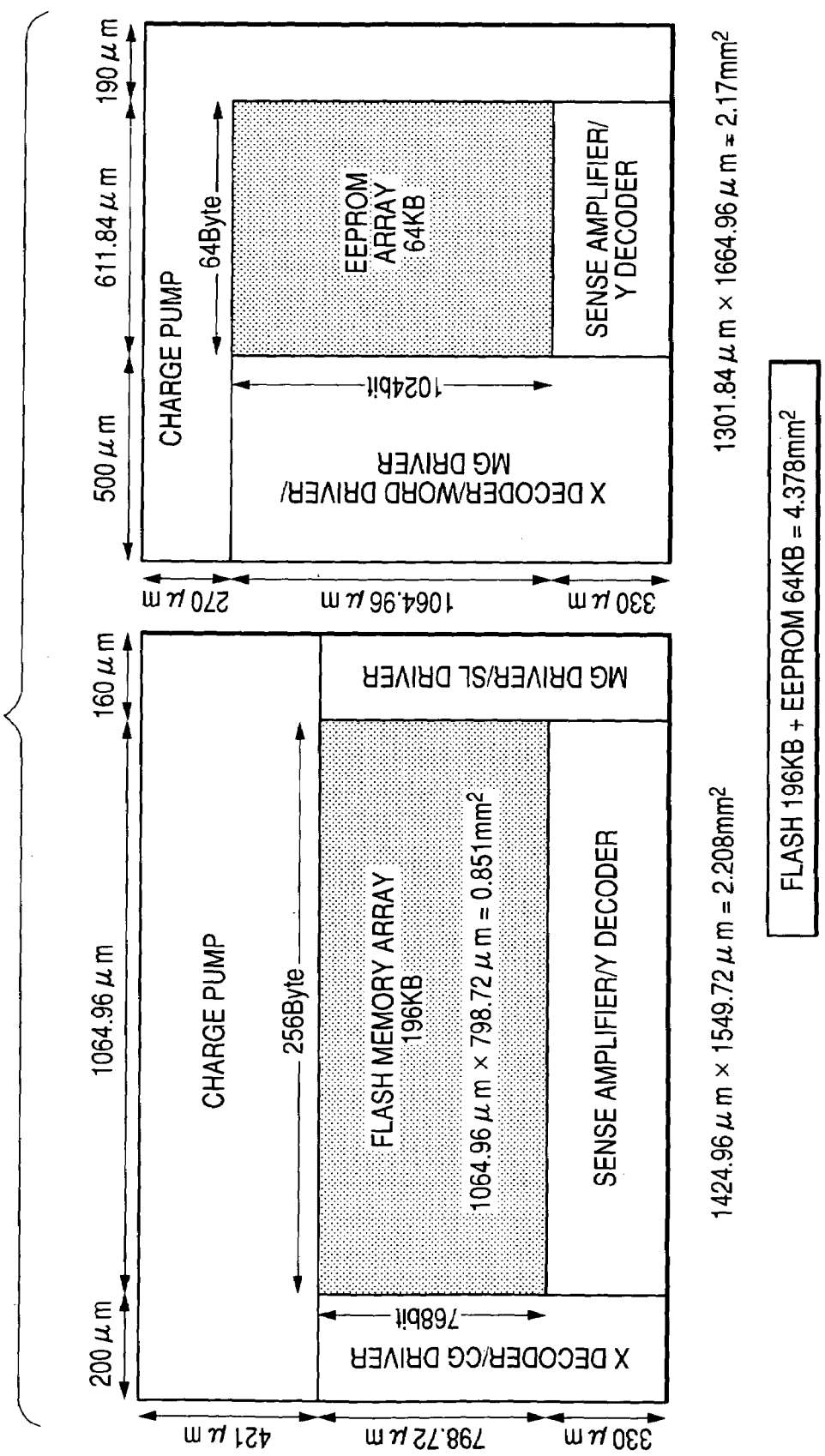
FIG. 8 is a diagram depicting comparison between the chip area occupied by a 196-Kbyte flash memory and the chip area occupied by a 64-Kbyte EEPROM, in accordance with an embodiment of the present invention.

FIG. 8 shows an example of comparison between the chip area occupied by a 196-Kbyte flash memory and the chip area occupied by a 64-Kbyte EEPROM, in accordance with an embodiment of the present invention. As shown in FIG. 8, the 196-Kbyte flash memory array and the 64-Kbyte EEPROM array are virtually the same size.

As one reason for replacing a ROM by a flash memory, it can be assumed that the flash memory is used to change or add application software in the field as mentioned above. Adding application software is accompanied by adding diverse types of data that may be rewritten at a high frequency associated with the application software. Accordingly, the EEPROM capacity is required to increase with the increase of data quantity to be stored into it.

Particularly for a semiconductor IC device whose chip area is limited, such as an IC card or the like, an increase of the EEPROM capacity is a serious problem.

If the chip area has determinate dimensions, then the EEPROM capacity is limited inevitably and may become insufficient to store data that is generated by an additional application. The limited EEPROM capacity would be a bottleneck for the extensibility of a system using such a semiconductor IC device.

Figure 15:
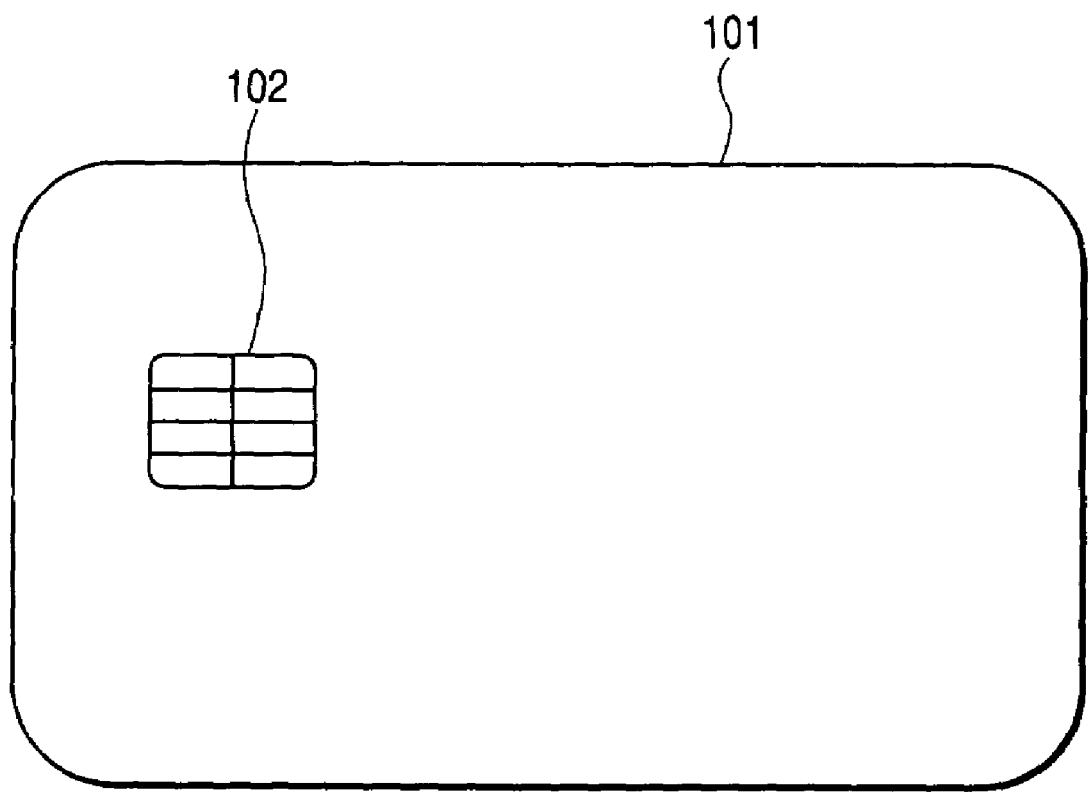
FIG. 15 is a schematic showing the hardware structure of an IC card equipped with the semiconductor IC device of the present invention.

FIG. 15 shows the hardware structure of an IC card 101 equipped with an IC chip of the present invention. The IC chip is installed in the IC card 101. On the surface of the IC card 101, there is a contact 102 for the IC card chip. The semiconductor IC device (IC chip) in question and the contact 102 for the IC card chip are connected inside the IC card 101. Through the contact 102 for the IC card chip, the semiconductor IC device (IC chip) is supplied with power from and communicates data with a reader/writer that exists externally to the IC card 101. In general, the contact for the IC card chip on a contact-type IC card comprises the following terminals in their given positions: supply voltage Vcc, ground GND, reset RST, input/output I/O, and clock CLK.

The hardware configuration of the IC chip that is installed in the IC card 101 is described here. The IC chip is made up of a CPU (Central Processing Unit) 2, a set of memories consisting of a ROM (Read Only Memory) 4, an SRAM (Static Random Access Memory) 5, and an EEPROM (Electrically Erasable Programmable Read Only Memory) 6, an I/O port 10 to interface with an external device, a clock generation circuit 8 to supply clocks to the CPU 2 and other circuits, a timer 3 for time control over a system timer and the memory circuits, a system control logic 9, a co-processor 7, an address bus 11, a data bus 12, and other components.

Figure 18:
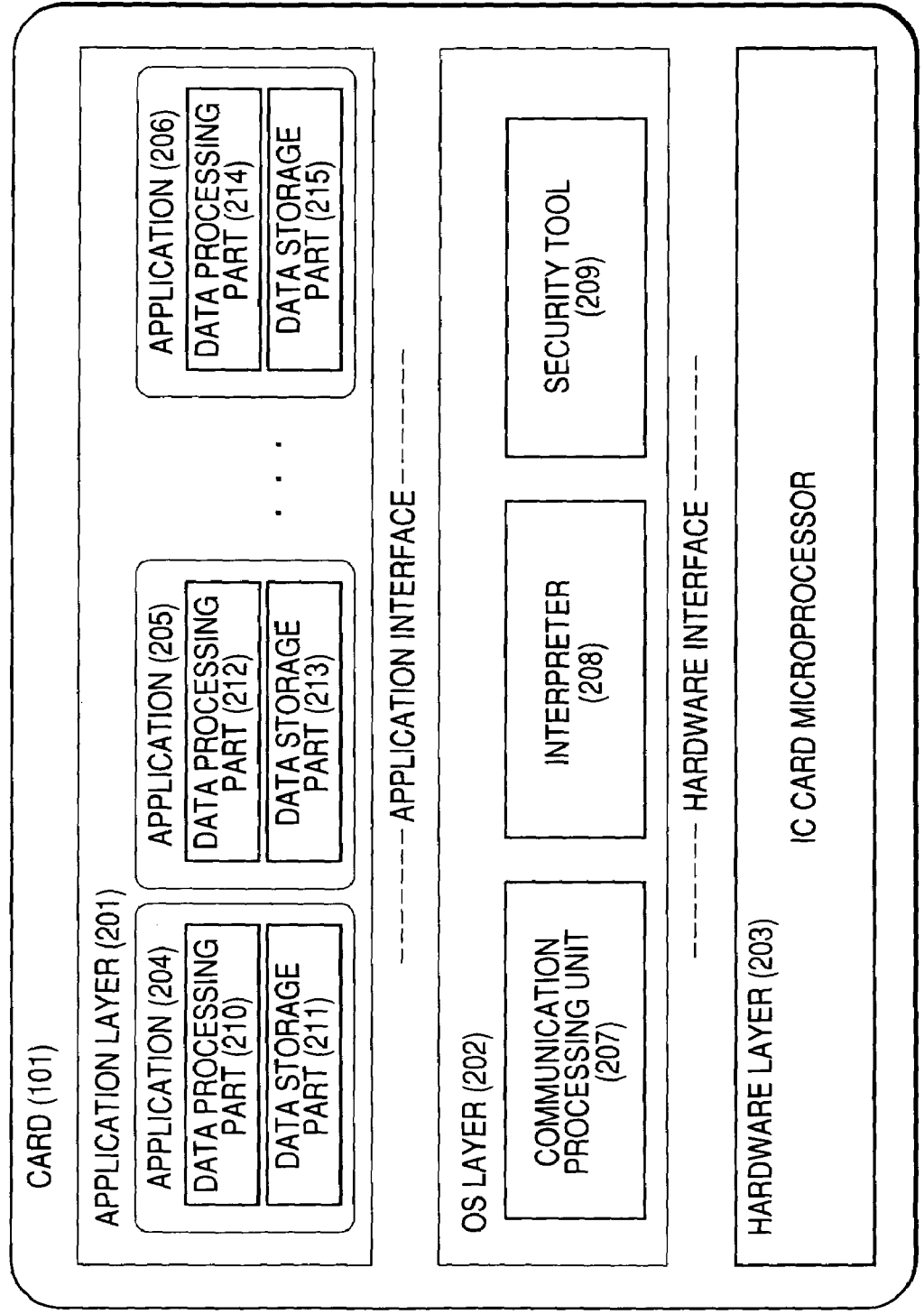
FIG. 18 is a diagram showing a logical organization of the semiconductor IC device of the present invention.

FIG. 18 shows a logical formation of basic segments of the IC chip that is installed in the IC card 101 of the present invention. The IC chip consists of a hardware layer 203, a segment where an operating system (OS) is installed, namely, an OS layer 202, and a segment where applications are installed, namely an application layer 201. This IC chip can be equipped with multi-applications; that is, a plurality of applications 204-206 can be installed in the application layer 201. An application (204) consists of a data storage part (211, 213, 215 each per application) and a data processing part (210, 212, 214 each per application). Even if a plurality of application programs 204-206 have been loaded, by switching among these application programs 204-206, each application program can be executed.

Operating Systems (OSs) for IC cards, allowing a plurality of applications to run together securely on a single card, that is, multi-application supporting card OSs include MULTOS® (a registered trademark of Mondex International Inc.), Java Card® (a registered trademark of Sun Microsystems Inc.), etc. The multi-application OSs enable a plurality of applications to run simultaneously on a single card and provide enhanced convenience. For example, instead of carrying three cards for different applications such as credit, e-money, and identification, these application programs can be installed in a singe IC card.

Dynamic loading means that such applications can be installed or uninstalled after the issuance of the IC card. Initial loading of applications means that the applications are installed in the IC card when the IC card is issued and the card having the applications installed therein is delivered to the card applicant.

The above applications are installed in the memory portion of the IC chip within the IC card. Processing programs, commands, and the like which take on the function of the data processing part of each application are stored into the flash memory.

The function of the data storage part of each application is physically carried out by the flash memory or EEPROM.

The applications include an application for storing e-money into the IC card and updating (in this instance, e-money data is updated in the data storage part), an application for letting the card holder use the IC card as digital railway or bus tickets, an application for letting the card holder use the IC card as an ETC (IC) card in conjunction with in-vehicle equipment, an application for letting the card holder use the IC card as a SIM card that is used in GSM mode operation of a mobile terminal (in this instance, personal information such as telephone numbers and address book entries, a key for communicating with a base station, and other data are updated in the data storage part), an application for letting the card holder use the IC card as a resident's card managed by a local government, an application for letting the card holder use the IC card as a health insurance card (in this instance, data for patient information including past medical records, health checks and their results, etc. is updated in the data storage part), an application for letting the card holder use the IC card as an employee identification (ID) card or student ID card for identification of the card holder, and so forth.

Embodiment 1

Figure 9:
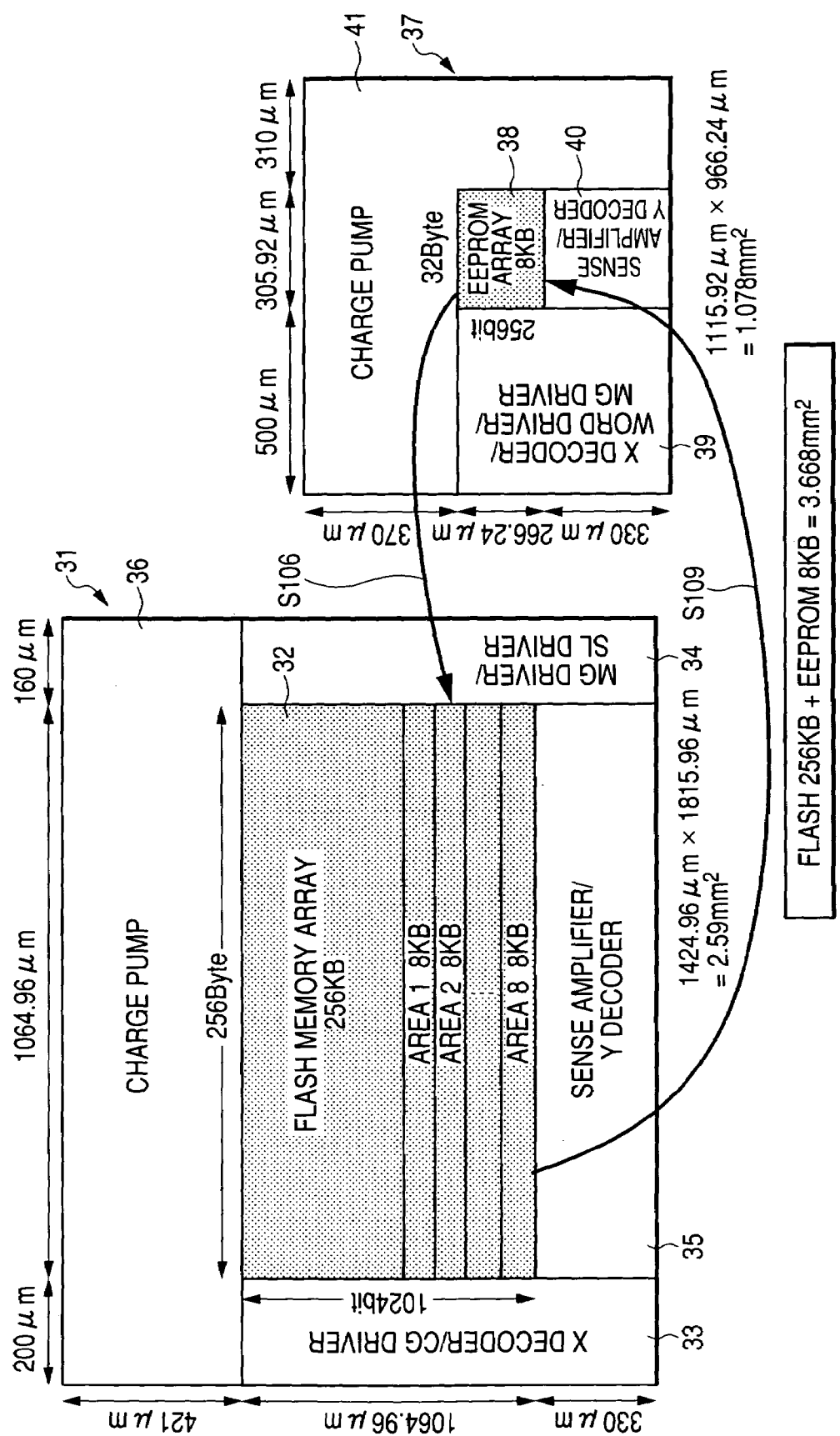
FIG. 9 is a diagram showing flash memory and EEPROM configurations according to a preferred Embodiment 1 of the present invention.

FIG. 9 is a diagram showing flash memory and EEPROM configurations according to a preferred Embodiment 1 of the present invention.

Figure 10:
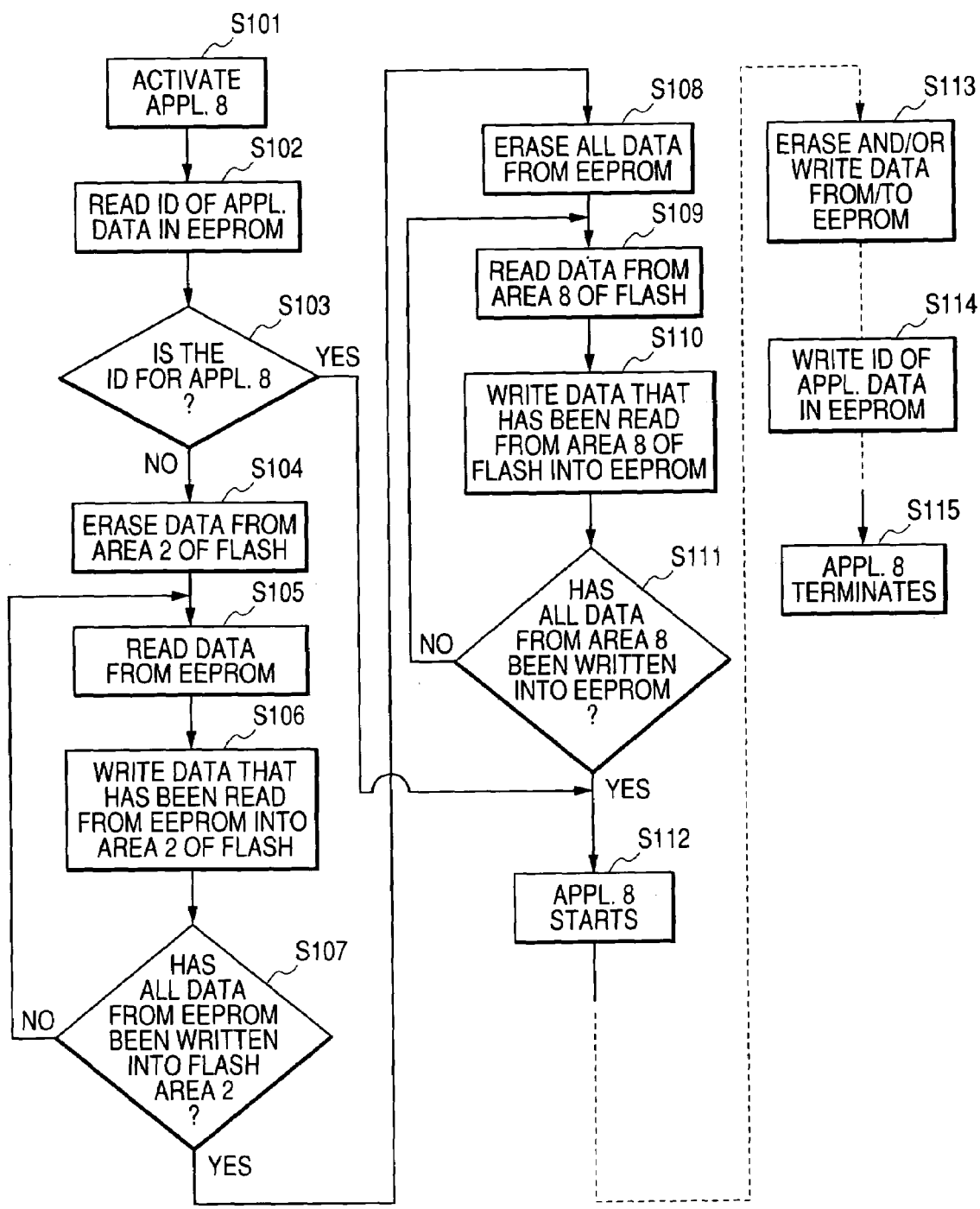
FIG. 10 is a flowchart illustrating read/write operations of the flash memory and the EEPROM according to Embodiment 1 of the present invention.

FIG. 10 is a flowchart illustrating the flow of read/write operations of the flash memory and the EEPROM in the semiconductor IC device (IC chip) of Embodiment 1.

FIG. 9 is an example of the flash memory and EEPROM configurations according to Embodiment 1. A flash memory 31 of Embodiment 1 is made up of, for example, a 256-Kbyte flash memory array 32, an X decoder/control gate driver 33, a memory gate driver/source line driver 34, a sense amplifier/Y decoder 35, a charge pump 36, and other components, which are laid out as shown in FIG. 9. An EEPROM 37 is made up of, for example, a 8-Kbyte EEPROM array 38, an X decoder/word driver/memory gate driver 39, a sense amplifier/Y decoder 40, a charge pump 41, and other components, which are laid out as shown in FIG. 9.

In this example, the flash memory array 32 is 256 bytes wide for the number of bit lines and 1024 bits high for the number of word lines. The capacity of the flash memory array 32 including areas 1 to 8 which will be described later is 256 Kbytes. The EEPROM array 38 is 32 bytes wide for the number of bit lines and 256 bits high for the number of word lines.

The capacity of the EEPROM 37 is more than or equal to the capacity of each one of the data storage areas (areas 1 to 8) respectively allocated for the applications.

Because the EEPROM capacity required to store data from the data storage part of one application is generally considered to be normally 8 Kbytes or less, the capacity of the EEPROM 37 is determined as 8 Kbytes. The flash memory 31 includes memory areas (areas 1 to 8) which are required for other applications, each area having a capacity of 8 Kbytes.

In the configuration examples of both memories shown in FIG. 9, the capacity of the EEPROM 37 is 8 Kbytes and the capacity of the flash memory 31 is 256 Kbytes. However, by applying a method of Embodiment 1 which is described below, operation using these memories can be performed.

FIG. 8 is a diagram depicting comparison between the chip area occupied by a 196-Kbyte flash memory and the chip area occupied by a 64-Kbyte EEPROM, in accordance with an embodiment of the present invention.

FIG. 9 is a diagram showing flash memory and EEPROM configurations according to a preferred Embodiment 1 of the present invention. The aggregate chip area occupied by the flash memory 31 and EEPROM 37 according to Embodiment 1, shown in FIG. 9, is about 20% less than the aggregate chip area occupied by the corresponding memories of FIG. 8, thus showing an effect of area reduction.

Then, the method of operation of the semiconductor IC device according to Embodiment 1 is described with reference to FIGS. 9 and 10.

The processing programs, commands, and the like which take on the functions of the data processing parts of the applications are written into the flash memory. Data from the data storage parts of the applications is written into both the flash memory and the EEPROM or the flash memory only. When an application is activated, the data stored in the flash memory from its data storage part is read from the flash memory and written into the EEPROM. If the data from the data storage part is updated, new information is written into the EEPROM. When another application is newly activated, the data existing in the EEPROM (i.e., the data from the data storage part of the application that was running just before that time) is written back into the flash memory. If the data from the data storage part has not been updated when another application is activated, the data existing in the EEPROM need not be written back into the flash memory and may be erased. Then, the data from the data storage part of the newly activated application is read from the flash memory and written into the EEPROM.

Therefore, only the data from the data storage part of an application is transferred between the flash memory and the EEPROM and the processing program, commands, and the like of the application are not transferred to the EEPROM.

For example, assume that the semiconductor IC device of Embodiment 1 has eight applications (applications 1 to 8) installed therein and the minimum necessary capacity to store data from the data storage part of any application is 8 Kbytes. The capacity of the EEPROM 37 to be used to store the data from the data storage part of one of the applications 1 to 8 is determined as 8 Kbytes and the flash memory 31 includes memory areas (areas 1 to 8), each having a capacity of 8 Kbytes, as the data areas to be used for the applications 1 to 8, respectively.

Application data that is stored into the areas 1 to 8 in the flash memory 31 and the EEPROM array 38 in the EEPROM 37 include application identification information such as application ID numbers.

With the setup as above, when, for example, application 8 is activated (step S101), the ID number of application data existing in the EEPROM array 38 is read (step S102) and it is checked whether the data in the EEPROM array 38 is the data of the application 8 (step S103).

If the data in the EEPROM array 38 is the data of the application 8, as the ID number that has been read is of the application 8, then the application 8 starts (step S112).

If the data in the EEPROM array 38 is the data of an application other than the application 8, as the ID number that has been read is not of the application 8, and if the data in the EEPROM array 38 is, for example, the data of application 2, as the ID number that has been read is of application 2, the data of the application 2 stored in the area 2 within the flash memory array 32 is erased (step S104).

Then, the data is read from the EEPROM array 38 (step S105) and transferred to and written into the area 2 within the flash memory array 32 (step S106).

When all the data existing in the EEPROM array 38 has been written into the area 2 within the flash memory array 32 (step S107), all the data is erased from the EEPROM array 38 (step S108).

Next, the data of the application 8 is read from the area 8 within the flash memory array 32 (step S109) and transferred to and written into the EEPROM array 38 (step S110). When all the data of the application 8 stored in the area 8 has been written into the EEPROM array 38 (step-S111), the application 8 becomes ready to run and the application 8 starts (step S112).

During the run of the application 8, when the CPU determines that data must be written into the EEPROM, data erasure and/or write from/to the EEPROM are performed (step S113). The data erasure and/or write from/to the EEPROM may occur a plurality of times, not only once, during the application run. Or, data may not be written to the EEPROM.

Then, the application terminates 8.

Even when an application other than the application 8 is activated and data of an application other than the application 2 exists in the EEPROM array 38, application data is handled in the same procedure as above.

The above-described data transfer between the flash memory 31 and the EEPROM 37 and data erasure and write from/to the memory may be performed by the CPU or other hardware structure.

Time taken for data transfer between the flash memory 31 and the EEPROM 37 and time taken for data erasure and write from/to the memory are regarded as overhead time when an application is activated. However, such over head time is estimated to be several hundred milliseconds to several seconds and has only a little effect on overall run.

While, in Embodiment 1, by way of example, it is assumed that the EEPROM capacity is 8 Kbytes, the flash memory capacity is 256 Kbytes, and EEPROM data areas within the flash memory are 8 Kbytes×8, the EEPROM capacity, flash memory capacity, and the EEPROM data areas within the flash memory are not limited to the above sizes, and may change, depending on the applications installed. The EEPROM data areas in the flash memory are the areas from where data is read and written into the EEPROM and to where data read from the EEPROM is written.

The following are some advantages of Embodiment 1 of the present invention:

(1) The flash memory includes the EEPROM data areas which are commonly used for the applications to store data from the data storage parts of the applications and the applications are stored into the flash memory. When an application is activated, its data from its data storage part is read from the flash memory and written into the EEPROM, updated, if necessary, and written back to the flash memory. Thus, the applications can run with the EEPROM having a minimum necessary capacity (equaling to the maximum data size set for the data storage parts of the applications), and the memory space for storing the applications can be reduced. Also, more applications can be installed.

(2) The data processing part of an application updates the application data stored in the EEPROM, and that data is written into the flash memory when the running application is switched to another one. Thus, memory space reduction noted in advantage (1) above is achieved, and the frequency of flash memory rewriting can be reduced. Consequently, the flash memory lifespan can be prolonged and the applications can be used for a period suitable for practical use.

Embodiment 2

Figure 11:
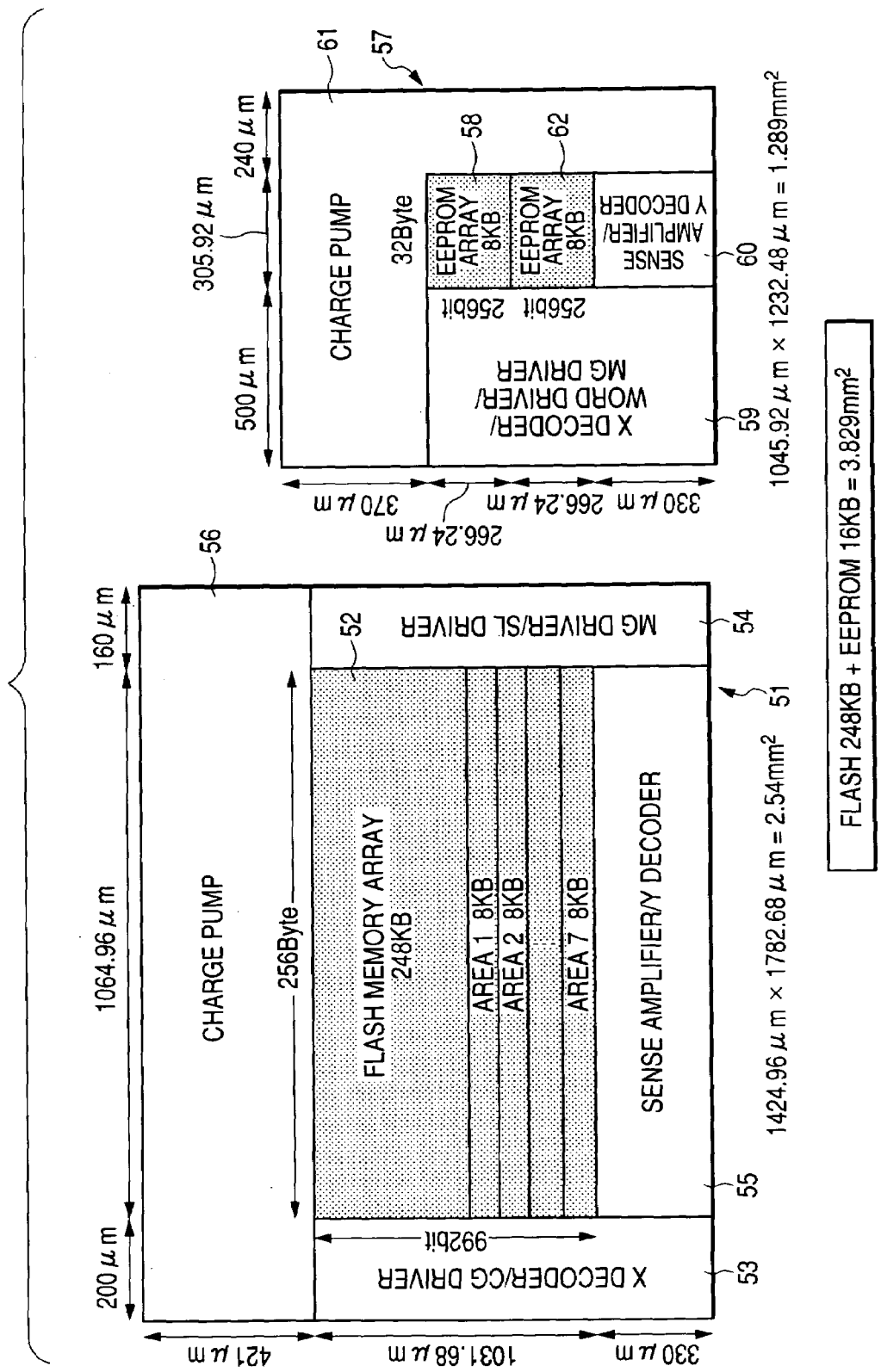
FIG. 11 is a diagram showing flash memory and EEPROM configurations according to a preferred Embodiment 2 of the present invention.

FIG. 11 is a diagram showing flash memory and EEPROM configurations according to a preferred Embodiment 2 of the present invention.

By way of example, the flash memory and EEPROM configurations according to Embodiment 2 are first described with reference to FIG. 11. The flash memory 51 of Embodiment 2 is made up of, for example, a 248-Kbyte flash memory array 52, an X decoder/control gate driver 53, a memory gate driver/source line driver 54, a sense amplifier/Y decoder 55, a charge pump 56, and other components, which are laid out as shown in FIG. 11. An EEPROM 57 is made up of, for example, 8-Kbyte EEPROM arrays 58, 62, an X decoder/word driver/memory gate driver 59, a sense amplifier/Y decoder 60, a charge pump 61, and other components, which are laid out as shown in FIG. 11.

The flash memory array 52 is 256 bytes wide for the number of bit lines and 992 bits high for the number of word lines. The capacity of the flash memory array 52 including areas 1 to 7, which will be described later, is 248 Kbytes.

The EEPROM arrays 58, 62 are 32 bytes wide for the number of bit lines and 256 bits high for the number of word lines.

The capacity of a memory array of the EEPROM 57 is more than the size of data to be handled by each application stored in the flash memory 51. Also, the capacity of a memory array of the EEPROM 57 is more than or equal to the capacity of each one of the data storage areas (areas 1 to 7) respectively allocated for the applications.

The flash memory 51 and the EEPROM 57 are used, for example, the flash memory 13 and the EEPROM 6 of the microcomputer 1 shown in the above FIG. 2.

The semiconductor IC device of Embodiment 2 has a feature that the EEPROM 57 includes two memory arrays, one for an application that is run frequently and the other for other applications, and the capacity of each memory array is 8 Kbytes, a total of 16 K bytes.

There are recent trends of integrating a plurality of traditional IC cards for different applications into one card. IC card applications include financial applications, official applications, and transportation-related applications, etc. The financial applications involve cache cards, credit cards, etc. The official applications involve licenses, resistant registry, and entrance and exit ID cards, etc. The transportation-related applications involve commuter pass, student commuter pass, and other pass cards. It is supposed that IC cards are not often used for financial and official applications, but IC cards may be used everyday as commuter passes and student computer passes in transportation-related applications.

If, among the applications installed in the IC card, an application is used routinely, and if the EEPROM has only the 8-Kbyte capacity, as shown in FIG. 9, in the case of the above Embodiment 1, the following will happen. Data of an application for transportation passenger use is usually stored in the EEPROM 37 and this data is transferred and stored into the flash memory 31 each time another application for financial or official use is activated.

Figure 16:
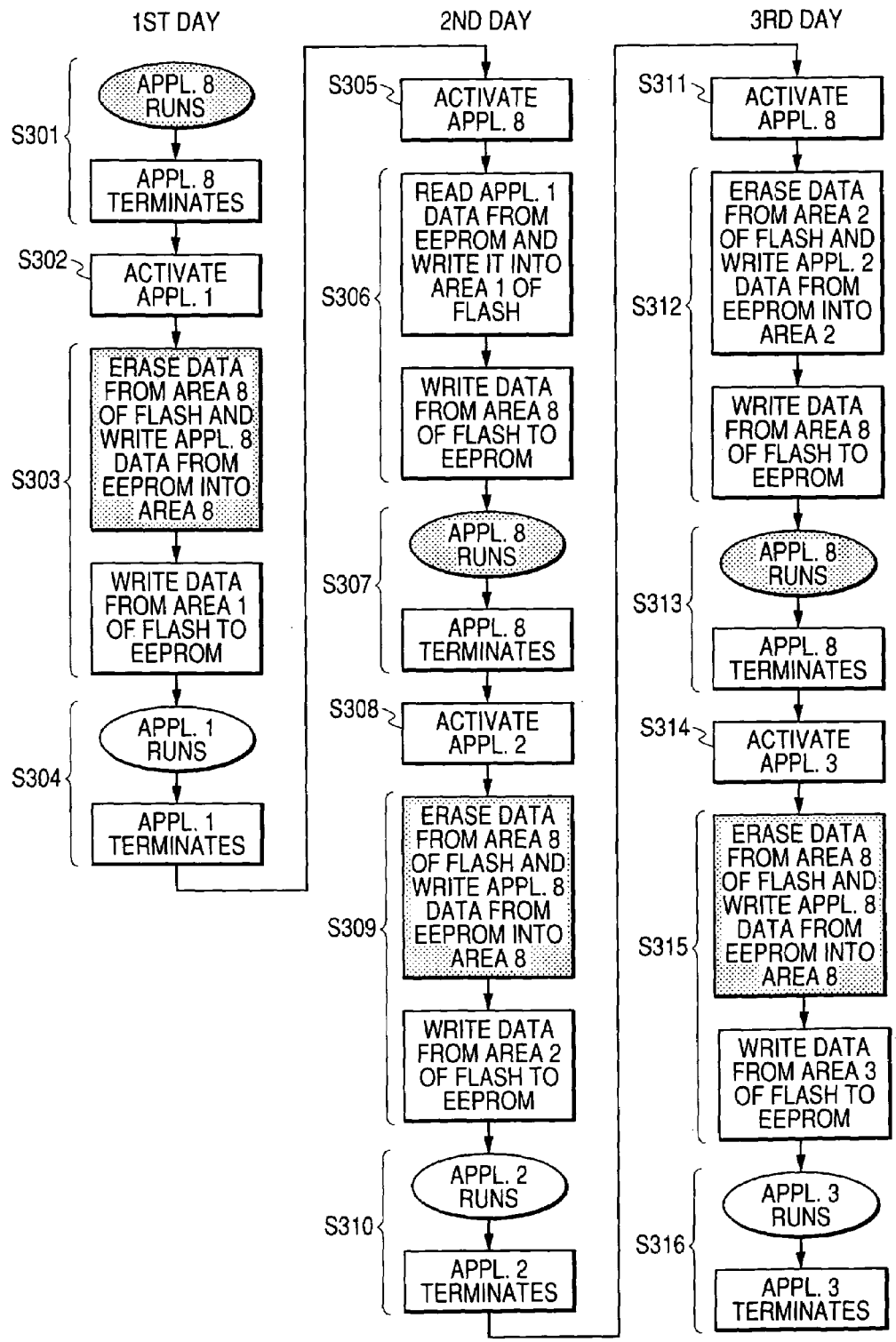
FIG. 16 is a flowchart illustrating read/write operations of the flash memory and the EEPROM according to Embodiment 1.

FIG. 16 is a flowchart illustrating these read/write operations of the flash memory and the EEPROM according to Embodiment 1. For example, assume that one application for transportation passenger use (application 8) is activated once everyday and seven applications for financial and official uses (applications 1 to 7) can also run, each of which is activated once a week randomly.

On the first day, the transportation passenger application 8 runs and terminates (step S301) and, when a financial or official application 1 is activated (step S302), the data of the application 8 now existing in the EEPROM is written into the area 8 of the flash memory. Upon the completion of writing the above data into the area 8 of the flash memory 8, data from the area 1 of the flash memory is written into the EEPROM (step S303). Upon the completion of this writing, the application 1 runs and terminates (step S304) and operation for the first day terminates.

On the second day, the application 8 is activated (step S305), as is on the first day, and the data of the application 1 now existing in the EEPROM is written into the area 1 of the flash memory. Upon the completion of writing of the above data into the area 1 of the flash memory, the data from the area 8 of the flash memory is written into the EEPROM (step S306). Upon the completion of this writing, the application 8 runs and terminates (step S307).

Next, when application 2 is activated (step S308), the data of the application 8 now existing in the EEPROM is written into the area 8 of the flash memory. Upon the completion of writing of the above data into the area 8 of the flash memory, the data from the area 2 of the flash memory is written into the EEPROM (step S309). Upon the completion of this writing, the application 2 runs and terminates (step S310) and operation for the second day terminates.

On the third day, the application 8 is activated (step S311), as is on the first and second days, and the data of the application 2 now existing in the EEPROM is written into the area 2 of the flash memory. Upon the completion of writing of the above data into the area 2 of the flash memory, the data from the area 8 of the flash memory is written into the EEPROM (step S312). Upon the completion of this writing, the application 8 runs and terminates (step S313).

Next, when application 3 is activated (step S314), the data of the application 8 now existing in the EEPROM is written into the area 8 of the flash memory. Upon the completion of writing the above data into the area 8 of the flash memory 8, data from the area 3 of the flash memory is written into the EEPROM (step S315). Upon the completion of this writing, the application 3 runs and terminates (step S316) and operation for the third day terminates.

Any of the applications 1 to 7 for financial and official uses is activated once a day in this way and, in consequence, rewriting of the data of the transportation passenger application 8 into the flash memory occurs once a day.

Therefore, if the maximum number of times that data can be rewritten into the flash memory 31 is 1000, the flash memory lifespan would terminate after the use of about 2.7 years (1000/365 days).

Accordingly, in Embodiment 2, the capacity of the EEPROM 57 is increased to 16 Kbytes and its half, 8-Kbyte EEPROM array is always allocated for the data of the transportation passenger application as shown in FIG. 11. This EEPROM configuration eliminates the need for transfer and rewrite of the data of the application for transportation passenger use that is used most frequently from the EEPROM 57 to the flash memory 51 and, in consequence, the flash memory lifespan extends.

The other 8-Kbyte EEPROM array is used for financial and official application data. The applications for financial and official uses are activated once a day on average as described above and the frequency of data transfer and rewrite to each one of the seven data areas 1 to 7 respectively allocated for the applications in the flash memory 51 is only once a week. If the maximum number of times that data can be rewritten into the flash memory 51 is 1000, it is possible to ensure the flash memory lifespan of about 20.8 years (1000/48 weeks) from calculation in terms of rewrite cycles only.

Figure 17:
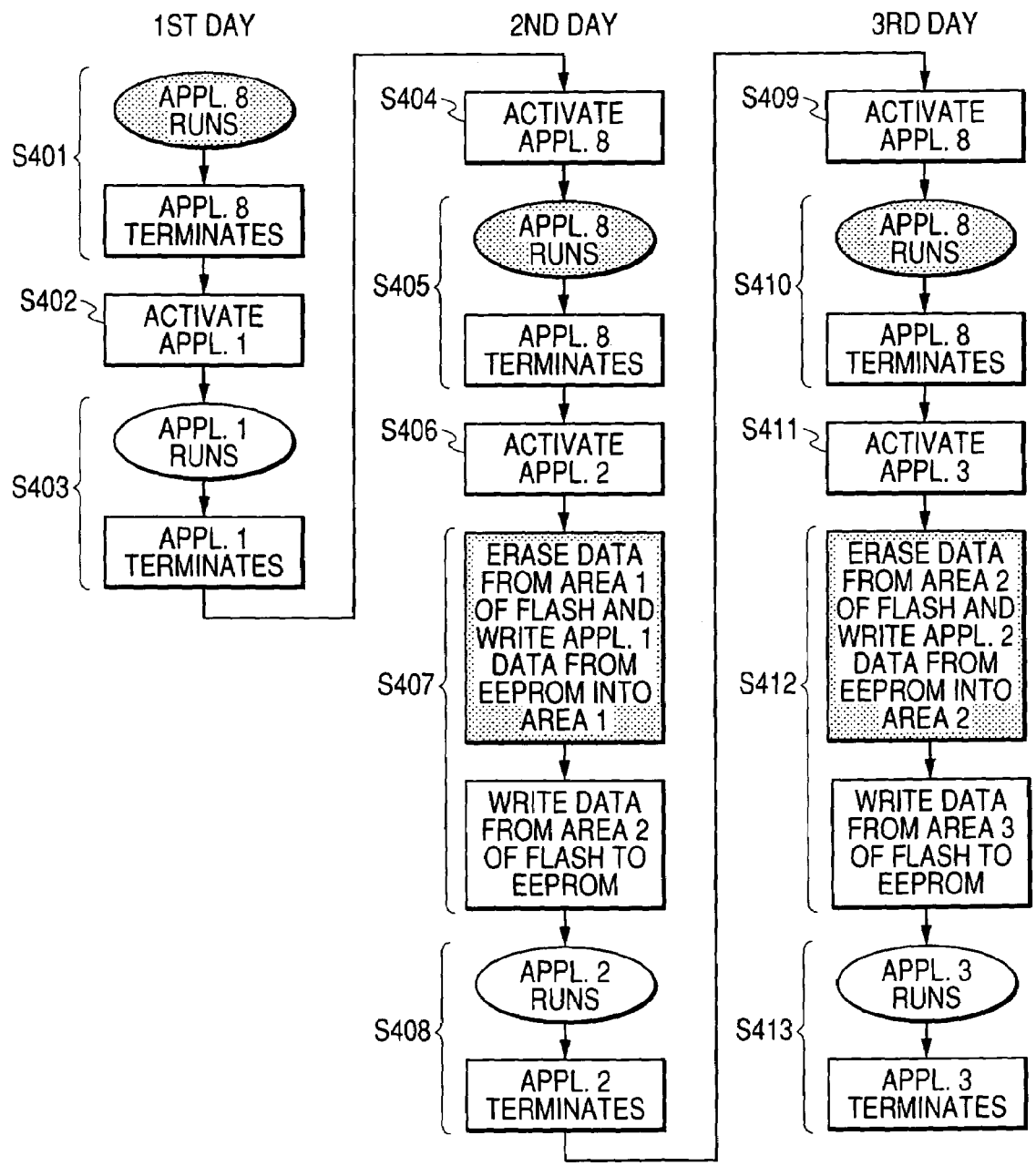
FIG. 17 is a flowchart illustrating read/write operations of the flash memory and the EEPROM according to Embodiment 2.

FIG. 17 is a flowchart illustrating these read/write 10, operations of the flash memory and the EEPROM according to Embodiment 2. On the first day, the transportation passenger application 8 runs and terminates (step S401) and, when the financial or official application 1 is activated (step S402), the application 1 runs and terminates (step S403). By using the EEPROM with the capacity of 16 Kbytes, data of two applications can remain in the EEPROM and rewrite to the flash memory does not occur.

On the second day, the application 8 is activated (step S404), as is on the first day, and the application 8 runs and terminates (step S405).

Next, when the application 2 is activated (step S406), application 1 data in the EEPROM is written into the area 1 of the flash memory. Upon completion of writing the above data into the area 1 of the flash memory, the data from the area 2 of the flash memory is written into the EEPROM (step S407). Upon the completion of this writing, the application 2 runs and terminates (step S408).

On the third day, the application 8 is activated (step S409), as is on the first and second days, and the application 8 runs and terminates (step S410). Next, when the application 3 is activated (step S411), the application 2 data in the EEPROM is written into the area 2 of the flash memory. Upon completion of writing the above data into the area 2 of the flash memory, the data from the area 3 of the flash memory is written into the EEPROM (step S412). Upon the completion of this writing, the application 3 runs and terminates (step S413).

As above, rewriting of the data of the transportation passenger application 8 to the flash memory does not occur. The applications 1 to 7 are activated once a week separately and rewriting to each of the data areas 1 to 7 allocated for them in the flash memory occurs only once a week.

While, in Embodiment 2, it is assumed that the EEPROM capacity is 16 Kbytes, the flash memory capacity is 248 Kbytes, and EEPROM data areas within the flash memory are 8 Kbytes×7, the EEPROM capacity, flash memory capacity, and the EEPROM data areas within the flash memory are not limited to the above sizes, and may change, depending on the applications installed. The EEPROM data areas in the flash memory are the areas from where data is read and written into the EEPROM and to where data read from the EEPROM is written.

According to Embodiment 2, in addition to the advantages noted in Embodiment 1, the following advantage is obtained:

(3) The EEPROM comprises an EEPROM area for data that may be updated by the data processing part of an application that is used at a high frequency and an EEPROM area for data that may be updated by the data processing part of an application that is used at a low frequency. This EEPROM configuration reduces the number of times of transfer of the data that may be updated by the data processing part of the application that is used at a high frequency between the EEPROM area and the flash memory. Consequently, the number of times of rewriting to the flash memory is reduced, which prolongs the flash memory lifespan. In multi-application OS environment, even if one of multiple applications is used at a high frequency, the applications can be used for a period suitable for practical use.

Next, a technique for cutting the time taken for transfer and the time taken for erasure/write is discussed. In Embodiments 1 and 2 of the present invention, time taken for data transfer between the flash memory and the EEPROM and time taken for data erasure and write are regarded as overhead time when the running application is switched to another as described above.

This overhead time is at an almost negligible level, so as not to degrade usability. However, in order to eliminate redundancy in transfer and erasure/write operations and minimize the number of times of these operations, a bit or data (access bit) is appended to data in the EEPROM to indicate whether the memory data has been rewritten after transferred from the flash memory. Upon a data rewrite to the EEPROM, the rewrite action changes the value of that bit or data to set the flag on.

Figure 12:
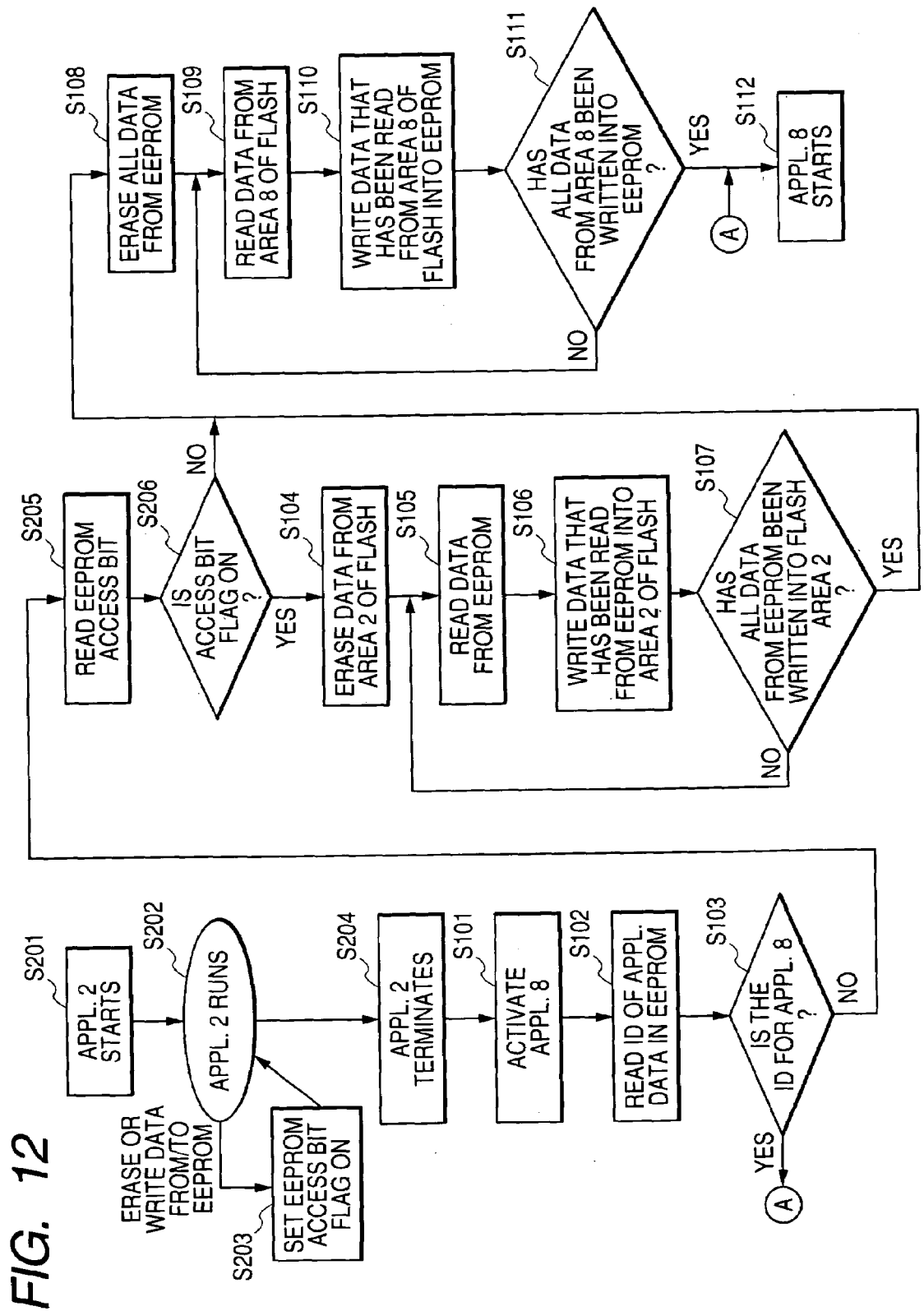
FIG. 12 is a flowchart illustrating read/write operations of the flash memory and EEPROM according to Embodiments 1 and 2 of the present invention, wherein data transfer and write are performed only when data in the EEPROM has been rewritten.

FIG. 12 is a flowchart illustrating the flow of read/write operations of the flash memory and EEPROM in the semiconductor IC device of Embodiments 1 and 2, wherein data transfer and write are performed only when data in the EEPROM has been rewritten.

Following the transfer of application data, for example, application 2 data from the flash memory to the EEPROM, the application 2 starts (step 201) and runs (step 202). This step where the application 2 starts (step 201) corresponds to the step 112 in the flowchart of FIG. 10.

If data is erased from or written into the EEPROM 37, 57 during the run of the application, the CPU or hardware sets the access bit flag on to indicate that the data has been erased or written (for example, set the access bit to "0") (step S203).

When the application 2 terminates (step S204) and another application (for example, application 8) is activated (step S101), the ID number of application data existing in the EEPROM is read (step S102), it is checked whether the data in the EEPROM array is the data of the application 8 (step S103), and the CPU or hardware reads the access bit (step S205). If the access bit is set on to indicate that the data has been erased or written (for example, this bit is "0") (step S206), the above-described procedure of FIG. 10 is performed, the data from the EEPROM 37, 57 is transferred to the flash memory 31, 51 (step S104 and subsequent). If the access bit flag is off (for example, "1"), the data existing in the EEPROM 37, 57 is not transferred to the flash memory 31, 51 and, instead, is erased (step S108). The data of the newly activated application (for example, application 8) is transferred from the flash memory 31, 51 and written into the EEPROM (steps S109, S110). Because other operations are the same as in the above Embodiment 1 (steps S111, S112, etc.), the explanation thereof is not repeated.

According to the above operations, if data has not been erased from or written into the EEPROM, that is, if the access bit flag is off (for example, the access bit value is "1"), time taken to erase data from the appropriate area of the flash memory and time taken to transfer the data from the EEPROM to the flash memory and to write the data into the area can be eliminated. Accordingly, the number of times of rewriting to the flash memory is reduced, which prolongs the flash memory lifespan.

Then, simplifying a data transfer means between the flash memory and the EEPROM is discussed with reference to FIGS. 13 and 14.

Figure 13:
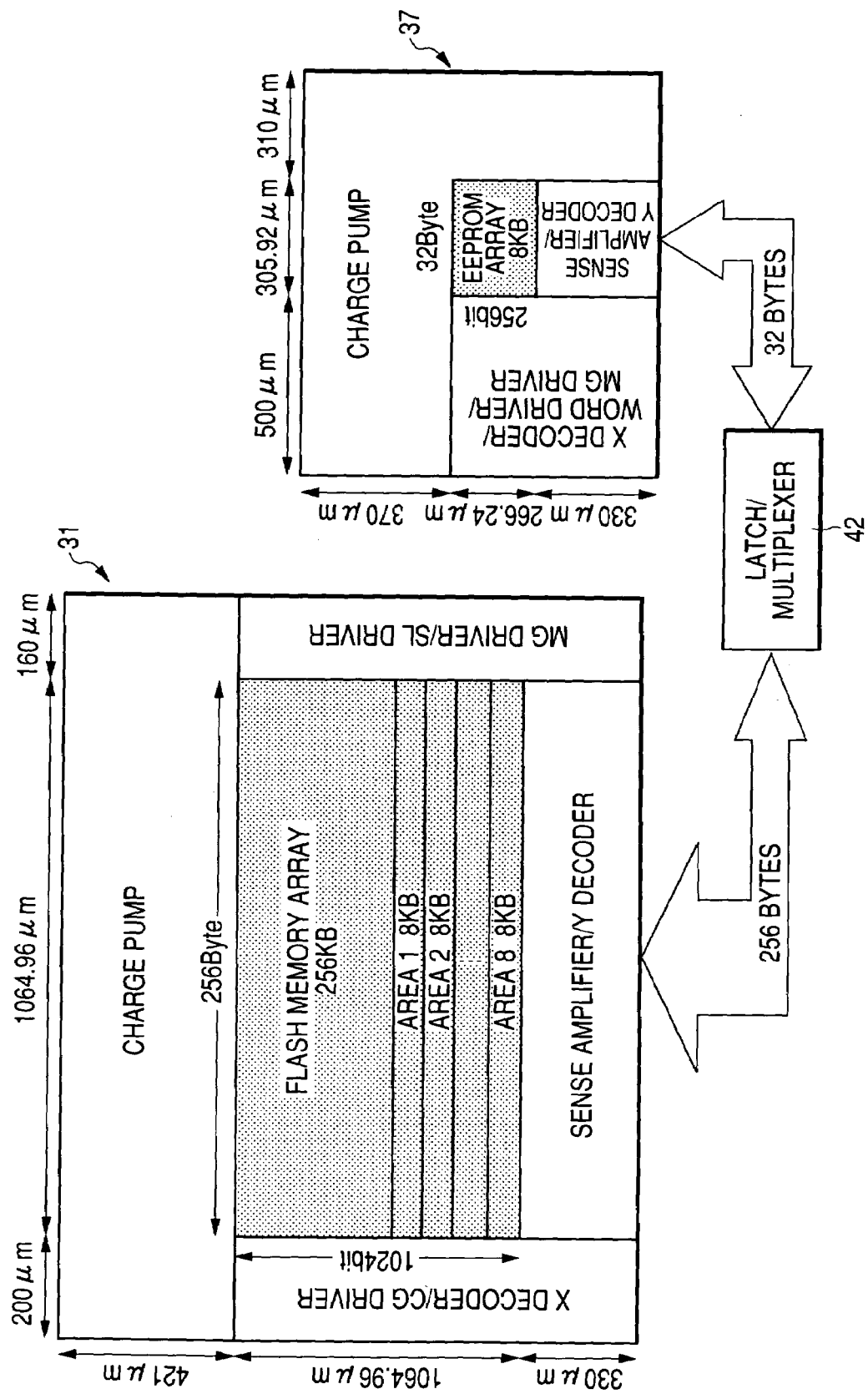
FIG. 13 is a diagram showing the flash memory/EEPROM configurations where the data width for the number of bits of the flash memory differs from the data width for the number of bit lines of the EEPROM in Embodiment 1 of the present invention.

FIG. 13 is a diagram showing the flash memory/EEPROM configurations where the data width for the number of bits of the flash memory differs from the data width for the number of bit lines of the EEPROM in Embodiment 1 of the present invention.

Figure 14:
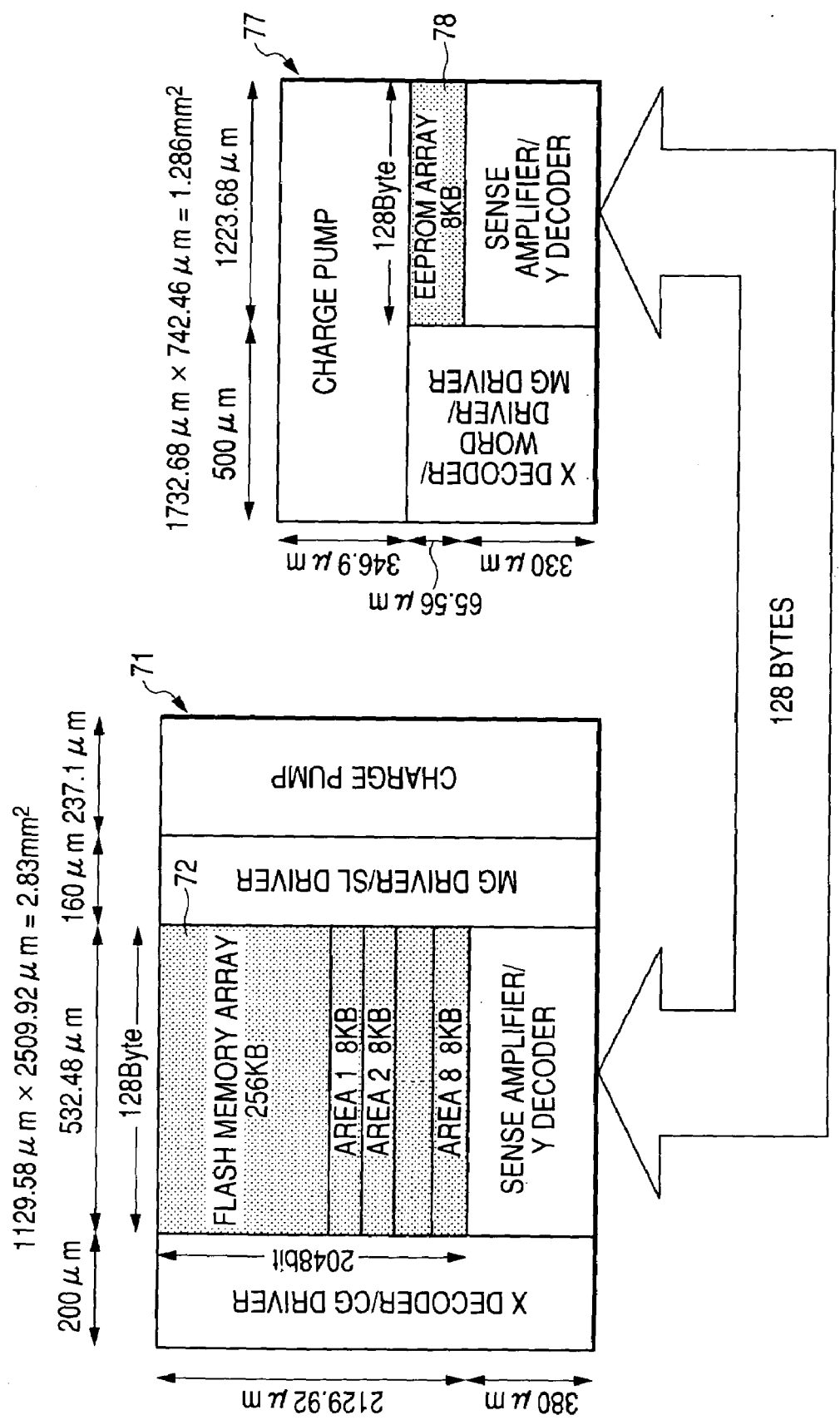
FIG. 14 is a diagram showing the flash memory/EEPROM configurations where the data width for the number of bits of the flash memory is equal to the data width for the number of bit lines of the EEPROM in Embodiment 1 of the present invention.

FIG. 14 is a diagram showing the flash memory/EEPROM configurations where the data width for the number of bits of the flash memory is equal to the data width for the number of bit lines of the EEPROM in Embodiment 1 of the present invention.

Generally, the data width for the number of bit lines of the flash memory differs from that width of the EEPROM, because of capacity and memory size differences between these memories, connections layout differences with other blocks. In the configuration examples of these memories shown in FIGS. 9 and 11, the flash memories 31, 51 have a 256-byte data width for the number of bit lines and the EEPROMs 37, 57 have a 32-byte data width for the number of bits lines.

In this situation, for example, when data is transferred from the flash memory 31 to the EEPROM 37 and written into the EEPROM, 256-byte data can be read at a time from the flash memory 31. But this data must be divided into eight parts and written into the EEPROM 38 eight times, because the maximum data size that can be written at a time into the EEPROM 37 is 32 bytes. Therefore, hardware (latch/multiplexer 42) which multiplexes bit line data must be installed on a data path between the flash memory 31 and the EEPROM 37, as shown in FIG. 13.

Conversely, when data is transferred from the EEPROM 37 to the flash memory 31 and written into the flash memory 31, a series of 32-byte data read from the EEPROM 37 must be latched once and, after 256-byte data has been latched, the 256-byte data must be written into the flash memory 31. Likewise, the hardware (latch/multiplexer 42) which latches bit line data must be installed on the data path between the flash memory 31 and the EEPROM 37.

FIG. 14 shows flash memory and EEPROM configurations dispensing with the hardware (latch/multiplexer 42) to multiplex and latch bit line data.

In the memory configurations shown in FIG. 14, the data width for the number of bit lines is determined as 128 bytes and both a flash memory 71 and an EEPROM 77 are configured to have that same data width.

The flash memory array 72 of the flash memory 71 is 128 bytes wide for the number of bit lines and 2048 bits high for the number of word lines. The capacity of the flash memory array including areas 1 to 8 is 256 Kbytes. The EEPROM array 78 of the EEPROM 77 is 128 bytes wide for the number of bits and 64 bits high for the number of word lines.

By configuring the flash memory and the EEPROM having the same data width for the number of bit lines, the hardware (latch/multiplexer 42) which is installed on the data path between the flash memory 31 and the EEPROM 37 shown in FIG. 14 can be dispensed. Further chip area reduction can thereby be achieved.

While, in FIG. 14, the data width for the number of bit lines of the flash memory and the EEPROM is determined as 128 bytes, it should be appreciated that the data width is variable, not limited to this size.

While, in FIG. 14, the flash memory and the EEPROM has the same data width for the number of bit lines, the data width for the number of the bit lines only in the portion of the EEPROM data storage areas (areas 1 to 8) may be equal to the data width for the number of bit lines of the EEPROM.

Lately, contactless IC cards have been available which are free of contacts and supplied with power and communicate data with a reader/writer by using electromagnetic waves induction, which were introduced through consideration of the usability of IC card users. Moreover, contact/contactless integrated IC cards which can be used as a contact card or contactless card, according to the application, are expected to come into popular use. While Embodiments 1 and 2 have been described for the example of the semiconductor IC device installed in the contact-type IC card as shown in FIG. 15, the semiconductor IC device of the invention can be installed in the above-mentioned contactless IC card, contact/contactless integrated IC card, and the like.

While the invention made by the present inventors has been described specifically, based on its preferred embodiments, it will be appreciated that the present invention is not limited to the illustrative embodiments described hereinbefore and can be altered, modified, or varied within the scope without departing from its spirit or essential characteristics.

For example, in the embodiments described hereinbefore, instances where the invention is applied to the microcomputer or IC card have been discussed. However, the invention is not so limited and can be applied to other semiconductor devices such as, for example, mobile terminals such as mobile phones.

While, in the embodiments described hereinbefore, instances where eight applications are run together on the IC card chip have been discussed, the invention is not so limited and can be applied to cases where any number of applications are run together.

While, in the embodiments described hereinbefore, the minimum necessary storage capacity to store the data of any application is determined as 8 Kbytes, the invention is not so limited and can be applied to cases where any memory capacity is set.

Advantages that are provided by typical aspects of the invention disclosed herein can be summarized below:

(1) Data transfer from the flash memory to the EEPROM and from the EEPROM to the flash memory is performed if necessary. Consequently, the EEPROM capacity can be reduced, the total nonvolatile memory area decreases, and chip area reduction can be achieved.

(2) The EEPROM comprises separate memory areas: one area from where data is transferred to the flash memory and to where data from the flash memory is transferred; and the other area which is not engaged in such data transfer. Consequently, data of an application that is very often used need not be transferred from the EEPROM to the flash memory and rewritten to the flash memory, and the flash memory lifespan extends.

What is claimed is:

1. A semiconductor device comprising:
a flash memory including nonvolatile memory cells configured to allow data to be written to and to be erased from the nonvolatile memory cells in units of blocks; and
an EEPROM which includes nonvolatile memory cells configured to allow data to be written to and to be erased from the nonvolatile memory cells in units of bytes;
wherein the flash memory is configured to store a plurality of applications, wherein each application of the plurality of applications includes a program for carrying out tasks of the application and data to be processed by the program, wherein the EEPROM comprises a first memory area and a second memory area, wherein when a first application of the plurality of applications is activated, data of the first application is loaded from the flash memory into the first memory area of the EEPROM, wherein the second memory area of the EEPROM is configured to store data of a second application of the plurality of applications, and wherein the first memory area is configured to retain data of the first application until a third application of the plurality of applications is activated.

2. The semiconductor device of claim 1, wherein after data of the first application is written from the EEPROM to the flash memory, data of the second application is configured to be written from the flash memory to the EEPROM.

3. The semiconductor device of claim 1, wherein while the data of the first application remains in the EEPROM, data of the plurality of applications other than the first application are stored in the flash memory.

4. The semiconductor device of claim 2, wherein a capacity of the EEPROM is substantially equal to a capacity of an area in the flash memory, wherein data of one of the plurality of applications is configured to be stored in the area in the flash memory.

5. The semiconductor device of claim 1, wherein the EEPROM is configured to store information indicating that a data erasure from or a data write to the data of the first application has been performed, and wherein the information is configured to allow a determination of whether the data of the first application is written from the EEPROM to the flash memory.

6. The semiconductor device of claim 1, wherein the data of the first application includes identification information to identify a particular application of the plurality of applications, and wherein the identification information is configured to allow a determination of whether the data of the first application is written from said flash memory to said EEPROM.

7. The semiconductor device of claim 1, further comprising:
a data path between the flash memory and the EEPROM; and
a first and second circuit connected to the data path between the flash memory and the EEPROM, wherein the first circuit is configured to multiplex bit line data, and wherein the second circuit is configured to latch bit line data.

8. The semiconductor device of claim 1, wherein a data width for the number of bit lines of the flash memory is equal to a data width for the number of bit lines of the EEPROM.

9. The semiconductor device of claim 1, wherein the semiconductor device is comprised in an IC card.

10. A semiconductor device, comprising:
a flash memory including nonvolatile memory cells configured to allow data to be written to and to be erased from the nonvolatile memory cells in units of blocks; and
an EEPROM which includes nonvolatile memory cells configured to allow data to be written to and to be erased from the nonvolatile memory cells in units of bytes,
wherein the flash memory is configured to store a plurality of applications,
wherein each application of the plurality of applications includes a program for carrying out tasks of the application and data to be processed by the program,
wherein when a first application of the plurality of applications is activated, data of the first application is loaded from the flash memory into the EEPROM and retained in the EEPROM until a second application of the plurality of applications is activated, and
wherein an update to the data during execution of the program of the first application is configured to be written into the EEPROM.

11. The semiconductor device of claim 10, wherein while the data of the first application remains in the EEPROM, data of the plurality of applications other than the first application are stored in the flash memory.

12. The semiconductor device of claim 10, wherein a capacity of the EEPROM is substantially equal to a capacity of an area in the flash memory, wherein data of one of the plurality of applications is configured to be stored in the area in the flash memory.

13. The semiconductor device of claim 10, wherein the EEPROM is configured to store information indicating that a data erasure from or a data write to the data of the first application has been performed, and wherein the information is configured to allow a determination of whether the data of the first application is written from the EEPROM to the flash memory.

14. The semiconductor device of claim 10, wherein the data of the first application includes identification information to identify a particular application of the plurality of applications, and wherein the identification information is configured to allow a determination of whether the data of the first application is written from said flash memory to said EEPROM.

15. The semiconductor device of claim 10, further comprising:
a data path between the flash memory and the EEPROM; and
a first and second circuit connected to the data path between the flash memory and the EEPROM, wherein the first circuit is configured to multiplex bit line data, and wherein the second circuit is configured to latch bit line data.

16. The semiconductor device of claim 10, wherein a data width for the number of bit lines of the flash memory is equal to a data width for the number of bit lines of the EEPROM.

17. The semiconductor device of claim 10, wherein the semiconductor device is comprised in an IC card.

18. The semiconductor device of claim 10, wherein the semiconductor device is comprised in a mobile terminal.

* * * * *